(12) United States Patent
Chu

(10) Patent No.: US 6,586,788 B1
(45) Date of Patent: Jul. 1, 2003

(54) INVERSION LAYER OPTICAL SWITCH

(75) Inventor: Junhao Chu, Shanghai (CN)

(73) Assignee: Tera Fiberoptics, Inc., Fremont, CA (US)

( * ) Notice: Subject to any disclaimer, the term of this patent is extended or adjusted under 35 U.S.C. 154(b) by 94 days.

(21) Appl. No.: 09/818,005

(22) Filed: Mar. 27, 2001

(51) Int. Cl.$^7$ .............................................. H01L 31/113
(52) U.S. Cl. ...................... 257/290; 257/462; 257/464; 257/465
(58) Field of Search ................................. 257/290, 291, 257/462, 464, 465, 466, 80; 359/248, 237, 245

(56) References Cited

U.S. PATENT DOCUMENTS 3,714,522 A  *  1/1973  Komiya et al. ......... 317/235 R

* cited by examiner

*Primary Examiner*—Sara Crane
(74) *Attorney, Agent, or Firm*—John F. Schipper

(57) ABSTRACT

A method and system for control of light transmitted through a p-type semiconductor material, configured as part of a metal-insulator-semiconductor (MIS) structure. A variable gate voltage is applied to generate a variable number of sub-band charge carriers near an insulator-semiconductor interface in the MIS structure. Where the gate voltage is lower than a threshold voltage, transmission of light propagating adjacent to and parallel to the interface is relatively high. As the gate voltage is increased to a value larger than the threshold voltage, the number of sub-band carriers raised to a first sub-band energy level increases approximately monotonically. If the light wavelength is selected to have an associated photon energy equal to an energy difference between a second sub-band (which may be the continuum) and the first sub-band, a variable portion of the light propagating in the semiconductor will be depleted in pumping the sub-band carriers from the first sub-band state to the second sub-band state, thus providing controllable attenuation of light that propagates through, and exits from, the MIS structure.

18 Claims, 2 Drawing Sheets

INVERSION LAYER OPTICAL SWITCH

FIELD OF THE INVENTION

This invention relates to optical switches that rely upon semiconductor action.

BACKGROUND OF THE INVENTION

Many types of optical switches have been proposed within the last 15 years, including switches based on temperature changes, refractive index changes, applied magnetic and/or electrical fields, and other environmental changes. Most of these structures are complex, requiring multiple layers of opto-electronic or semiconductor materials that are switched between two or more states using complex control mechanisms. Further, most of these systems provide only two states, fully on and fully off, and do not provide for controllable partial transmission of the light.

What is needed is a simpler system for switching light that does not depend upon a multi-layer opto-electronic or semiconductor material and that provides full, partial or zero transmission of incident light, controlled by a single gate voltage value. Preferably, the gate voltage difference between a substantially fully transmissive state and a fully absorptive state should be large enough

SUMMARY OF THE INVENTION

These needs are met by the invention, which uses a simple MIS semiconductor system and an electrical field source to controllably absorb or transmit light having a selected wavelength $\lambda$ or range of wavelengths that is received at the semiconductor. A gate voltage $V_g$ is applied in a selected direction (transverse) relative to the direction of propagation of light parallel to a gate-insulator-semiconductor interface. In a first state, the gate voltage $V_g$ is much less than the gate voltage threshold $V_g(thr)$ required for semiconductor inversion near the gate (including $V_g=0$). Substantially full transmission of light parallel to the interface occurs in the first state. In a second state, the gate $V_g$ is approximately equal to $V_g(thr)$, being somewhat less than or somewhat greater than the inversion threshold. As $V_g$ is increased within this voltage range, light transmission varies from a high value (≈70–90 percent) to nearly 0 percent. In a third state, the gate voltage $V_g$ is much greater than $V_g(thr)$, and light transmission in this third state is substantially zero. The light transmission percentage is controlled by a fraction of sub-band carriers (holes or electrons) that accumulate near the insulator-semiconductor interface and that are available to absorb photons of energy $E=hc/\lambda$ from the incident light.

DESCRIPTION OF BEST MODES OF THE INVENTION

Figure 1:
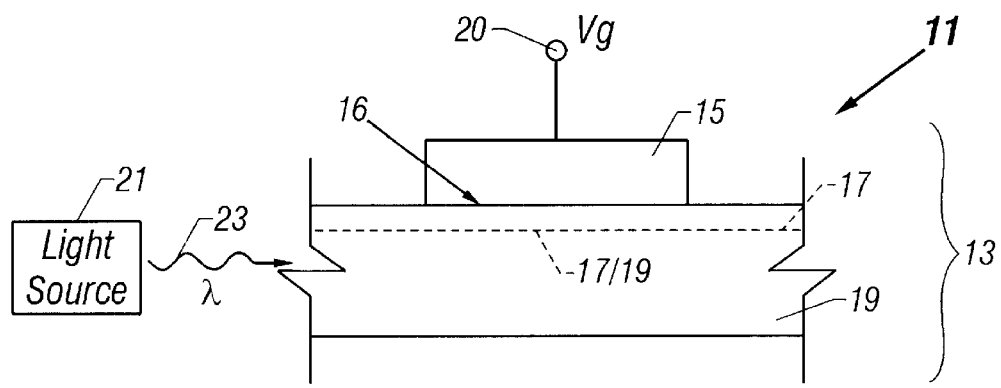
FIG. 1 is a schematic illustration of a system to practice the invention.

FIG. 1 schematically illustrates a system 11 suitable for practicing the invention. The system 11 includes an MIS structure 13, including a gate region 15 (metal or highly electrically conductive semiconductor), an oxide or other insulator region 17, and a semiconductor material 19. As an example, the metal layer may be 0.5×1 mm with a thickness of about 30 nm, and the oxide layer and semiconductor layer may have thicknesses of about 50 nm and at least 1 $\mu$m, respectively. The semiconductor material may be Si, Ge, GaAs, $Hg_xCd_{1-x}Te$ (0<x<1), CdTe or a similar material, suitably doped.

The gate region 15 is connected to a controllable voltage source 20 that can supply a gate voltage $V_g$ ranging from a first voltage value $V_{g1}\approx 0$ to a second voltage value $V_{g2}$ (≈4–8 volts) whose magnitude satisfies $|V_{g2}|>>V_g(thr)$, where $V_g(thr)$ is a threshold gate voltage at which inversion occurs in the semiconductor material (i.e., at which a selected fraction of available sub-band majority carriers is accumulated at or near the insulator-semiconductor interface). Semiconductor inversion is discussed by R. S. Muller and T. I. Kamins in *Device Electronics For Integrated Circuits*, John Wiley & Sons, New York, Second Edition, 1986, pp. 383–388. The information in this material is incorporated herein by reference.

A light source 21 generates a beam 23 of light having a pulse length $\Delta t$ and a selected wavelength $\lambda$, or a range of wavelengths near the selected wavelength $\lambda$, and directs the beam through an ambient medium (e.g., a vacuum) toward an exposed face of the MIS structure 13. A portion of this incident light beam is refracted into the MIS structure and propagates close to, and approximately parallel to, an interface 17/19 between the insulator region 17 and the semiconductor region 19. Where light propagates parallel to the interface 17/19, the gate region 15 preferably has a relatively long channel length, such as d=0.5–1 mm, so that the propagating light can be nearly completely absorbed when the MIS structure is in a selected (opaque) state.

In one embodiment of the invention, a p-type semiconductor MIS structure 13 is provided with a gate voltage $V_g$ that can be changed continuously or discretely from a value far below threshold ($V_g<<V_g(thr)$; for example, $-2 \text{ v} \leq V_g \leq 2 \text{ v}$) to a value much greater than threshold ($V_g>>V_g(thr)$; for example, $4 \text{ v} \leq V_g \leq 8 \text{ v}$). In the below-threshold situation, the number of sub-band carriers accumulated near the interface 17/19 is substantially zero, and the equivalent differential reflection for light at the exposed surface of the MIS structure 13 is small; this corresponds to an equivalent refractive index n for the MIS material that is close to 1 (e.g., $n \leq 1.3$) for the semiconductor material. As the gate voltage increases above the threshold value $V_g(thr)$, the number of sub-band carriers accumulated near the interface 17/19 increases monotonically to a large number, and the differential reflection for light at the exposed surface of the MIS structure 13 is much larger. At least two configurations are possible: (1) a parallel configuration, in which light is transmitted parallel to the inversion layer interface, as discussed in the preceding; and (2) a perpendicular configuration, in which light is transmitted perpendicular to the inversion layer interface.

Figure 2:
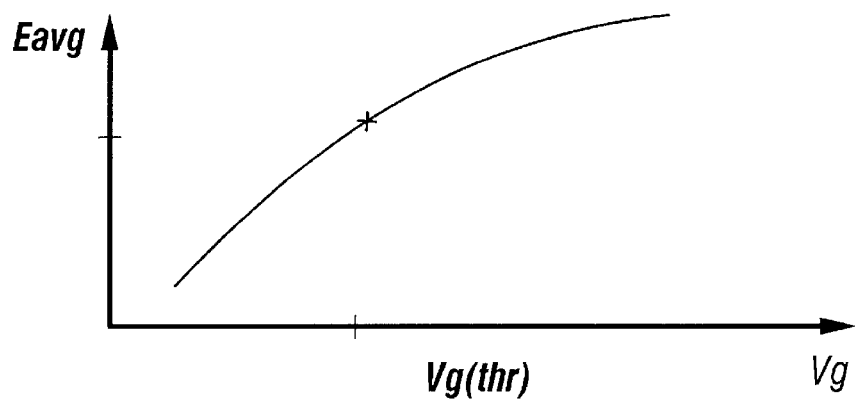
FIG. 2 is a graphical illustration of sub-band carrier energies for different gate voltages.

Parallel Configuration. When the MIS device has relatively low gate voltage $V_g$, the transmission layer has small reflection coefficient and relatively low light absorption coefficient: the switch is "conducting" or relatively transparent, with a maximum transparency coefficient in a range 0.7–0.9. When the MIS device has a relatively high magnitude gate voltage ($V_g>>V_g(thr)$), at least first and second sub-bands are created near the surface, the first (lower) sub-band being relatively filled and the second (higher) sub-band being relatively empty. The wavelength $\lambda$ of light to be transmitted through the light propagation region is chosen to correspond to $\Delta E(1-2)=hc/\lambda$, where $\Delta E(1-2)$ is the energy required to raise a carrier from the first sub-band to the second sub-band. When a light pulse with wavelength $\lambda$ propagates within the propagation region, a substantial portion of this light is absorbed in raising carriers from the first sub-band to the second sub-band. The light pulse substantially disappears after propagation through the transmission layer, and the switch is in a "non-conducting" or opaque state. FIG. 2 illustrates graphically a variation of average sub-band carrier energy with increasing gate voltage $V_g$. For example, a sub-band energy $\Delta E(1-2)=0.83$ eV corresponds to a wavelength $\lambda \approx 1500$ nm for a low transparency (opaque) state. Preferably, the gate voltage $V_g$ and/or the semiconductor doping are chosen to provide an optimum value for $\Delta E(1-2)$ corresponding to a desired wavelength $\lambda$, which depends upon gate voltage $V_g$.

Perpendicular Configuration. When the gate voltage $V_g << V_g(\text{thr})$, the interface 17/19 has a small reflectance or absorbance for an incident light beam with an appropriate wavelength $\lambda$, and the system is relatively transparent. When the gate voltage $V_g >> V_g(\text{thr})$, the interface 17/19 has a relatively large reflectance or absorbance for the incident light beam with the wavelength $\lambda$, and the system is relatively opaque.

Figure 3:
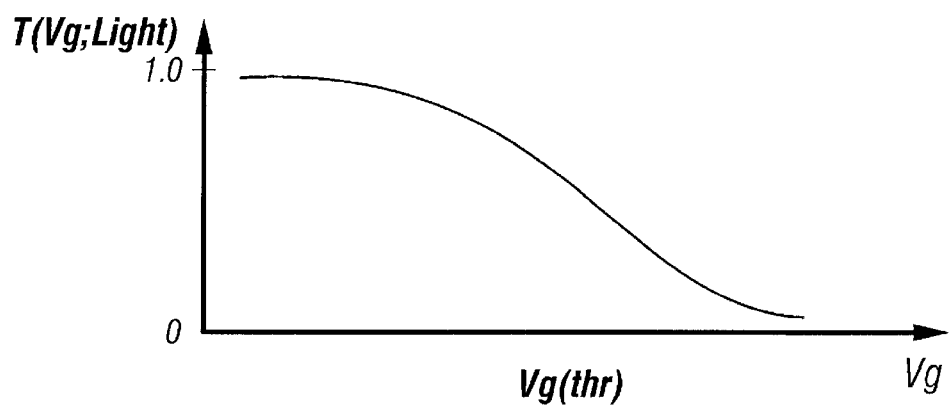
FIG. 3 is a graphical illustration of variation of percentage transmission of light through an MIS structure for different gate voltages.

When the MIS structure 13 is in an opaque state, most or all of the light beam energy is absorbed to "pump" the sub-band majority carriers from the first sub-band to the second sub-band. As the gate voltage $V_g$ is raised from a first value $V_g << V_g(\text{thr})$ to a second value $V_g >> V_g(\text{thr})$, the percentage transmission $T(V_g;\text{light})$ of the incident light beam decreases continuously from a first, relatively high value T1 (e.g., T1≈0.7–0.9) to a second, very small value T2 (e.g., T2≈0), as illustrated in FIG. 3. The gate voltage $V_g$ can be rapidly changed from the first value to the second value, or from the second value to the first value, so that the MIS structure functions as an optical switch, for light having appropriate wavelengths, in the parallel or perpendicular configuration.

A sub-band carrier will decay from a state (2) to a state (1) in a time interval of length estimated to be $\Delta t(2-1)=0.01-1$ μsec, and optical switching from a first gate voltage to a second gate voltage is preferably performed in a time interval of length not less than $\Delta t(2-1)$.

In another embodiment, only one sub-band is created, below a continuous energy band, and the light wavelength is chosen so that $\Delta E(1-\text{cont}))=hc/\lambda$, where $\Delta E(1-\text{cont})$ is the energy required to raise a carrier from the first sub-band to the continuum state(s). Subsequent decay is usually not a problem for such Rydberg transitions. Variation with gate voltage of the percentage transmission $T(V_g;\text{light})$ for this situation is similar to that shown in FIG. 3.

Figure 4:
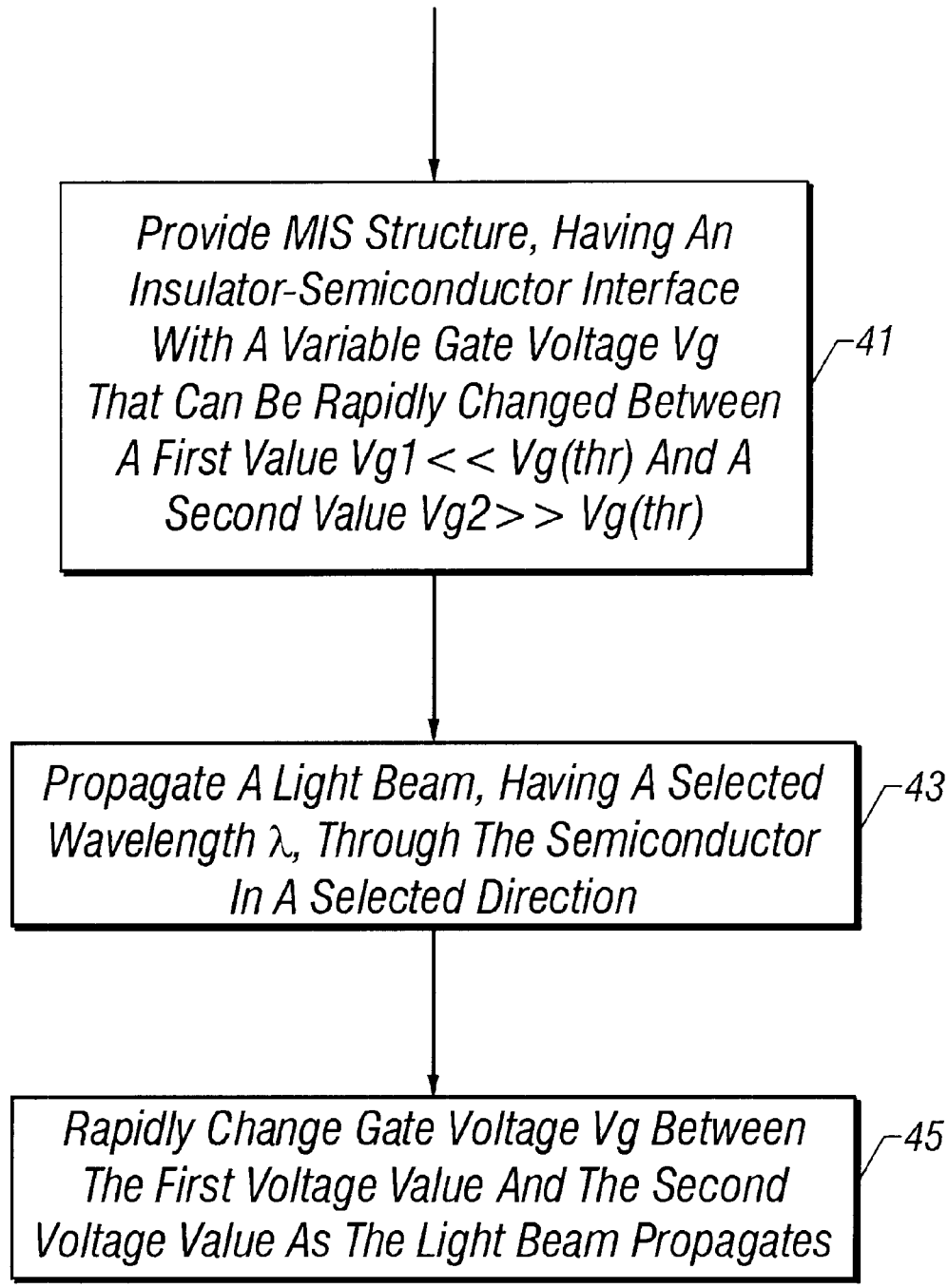
FIG. 4 is a flow chart of a procedure for practicing the invention.

FIG. 4 is a flow chart of a method for practicing the invention. In step 41, an MIS structure, having an insulator-semiconductor interface, is provided with a variable gate voltage $V_g$ that can be rapidly changed, from a first value $V_{g1} << V_g(\text{thr})$ to a second value $V_{g2} >> V_g(\text{thr})$, or from a second value $V_{g2} >> V_g(\text{thr})$ to a first value $V_{g1} << V_g(\text{thr})$. In step 43, a light beam having a selected wavelength $\lambda$ is propagated through the semiconductor in a selected direction (e.g., adjacent to and parallel to, or perpendicular to, the interface). In step 45, the gate voltage is rapidly changed between the first value $V_{g1}$ and the second gate voltage value $V_{g2}$ (from one to the other) as the light beam propagates.

What is claimed is:

1. A method of controlling transmission of light through a semiconductor material, the method comprising:

providing a metal-insulator-semiconductor (MIS) structure, having an insulator-semiconductor material interface, with a source of a gate voltage, connected to the metal, that can be rapidly changed from a first voltage value to a second voltage value, where the light beam has a selected first percentage transmission and a selected second percentage transmission, respectively, through the structure, where the first and second percentage transmissions differ substantially;

propagating a light beam having a selected wavelength $\lambda$ through the semiconductor in a selected direction, adjacent to and substantially parallel to the interface; and rapidly changing the gate voltage between the first value and the second value as the light beam propagates.

2. The method of claim 1, further comprising choosing one of said first gate voltage value and said second gate voltage value so that a maximum percentage of said light is transmitted through said MIS structure.

3. The method of claim 1, further comprising choosing one of said first gate voltage value and said second gate voltage value so that a minimum percentage of said light is transmitted through said MIS structure.

4. The method of claim 1, further comprising choosing said first gate voltage value so that a selected percentage ρ of said light is transmitted through said MIS structure, where ρ satisfies 0<ρ<100, when said gate voltage is equal to said first gate voltage value.

5. The method of claim 1, further comprising choosing said second gate voltage value so that a selected percentage ρ of said light is transmitted through said MIS structure, where ρ satisfies 0<ρ<100, when said gate voltage is equal to said second gate voltage value.

6. The method of claim 1, further comprising choosing said first gate voltage value so that substantially no charge carriers in said semiconductor occupy a selected first energy state above a ground energy state when said gate voltage has said first gate voltage value.

7. The method of claim 6, further comprising choosing said second gate voltage value so that a large fraction of charge carriers in said semiconductor occupy said first energy state when said gate voltage has said second gate voltage value.

8. The method of claim 7, further comprising selecting said wavelength $\lambda$ so that absorption of a photon having said wavelength $\lambda$ by a charge carrier occupying said first energy state will raise the charge carrier from said first energy state to a selected second energy state.

9. The method of claim 7, further comprising selecting said wavelength $\lambda$ so that absorption of a photon having said wavelength $\lambda$ by a charge carrier occupying said first energy state will raise the charge carrier from said first energy state to a continuum state.

10. A system for controlling transmission of light through a semiconductor material, the system comprising:

a metal-insulator-semiconductor (MIS) structure, having an insulator-semiconductor material interface, with a source of a gate voltage, connected to the metal, that can be rapidly changed from a first voltage value to a second voltage value, where the light beam has a selected first percentage transmission and a selected second percentage transmission, respectively, through the structure, where the first and second percentage transmissions differ substantially, the MIS structure being oriented to receive a light beam having a selected wavelength $\lambda$ so that the light beam travels through the semiconductor in a selected direction, adjacent to and substantially parallel the interface; and a gate voltage source, connected to the metal, that can be rapidly changed between the first gate voltage value and the second gate voltage value.

11. The system of claim 10, wherein one of said first gate voltage value and said second gate voltage value is chosen so that a maximum percentage of said light is transmitted through said semiconductor.

12. The system of claim 10, wherein one of said first gate voltage value and said second gate voltage value is chosen so that a minimum percentage of said light is transmitted through said semiconductor.

13. The system of claim 10, wherein said first gate voltage value is chosen so that a selected percentage ρ of said light is transmitted through said MIS structure, where ρ satisfies 0<ρ<100, when said gate voltage is equal to said first gate voltage value.

14. The system of claim 10, wherein said second gate voltage value is chosen so that a selected percentage ρ of said light is transmitted through said MIS structure, where ρ satisfies 0<ρ<100, when said gate voltage is equal to said second gate voltage value.

15. The system of claim 10, wherein said first gate voltage value is chosen so that substantially no charge carriers in said semiconductor occupy a selected first energy state above a ground energy state when said gate voltage has said first gate voltage value.

16. The system of claim 15, wherein said second gate voltage value is chosen so that a large fraction of charge carriers in said semiconductor occupy said first energy state when said gate voltage has said second gate voltage value.

17. The system of claim 16, wherein said wavelength λ is selected so that absorption of a photon having said wavelength λ by a charge carrier occupying said first energy state will raise the charge carrier from said first energy state to a selected second energy state.

18. The system of claim 16, wherein said wavelength λ is selected so that absorption of a photon having said wavelength λ by a charge carrier occupying said first energy state will raise the charge carrier from said first energy state to a continuum state.

* * * * *